United States Patent
Ireland et al.

(10) Patent No.: US 7,039,854 B1
(45) Date of Patent: May 2, 2006

(54) METHOD AND APPARATUS FOR PERFORMING SYNDROME COMPUTATION IN A DECODER OF A FORWARD ERROR CORRECTION (FEC) SYSTEM

(75) Inventors: Howard H. Ireland, Woodstock, GA (US); Jeffery T. Nichols, Marietta, GA (US)

(73) Assignee: CIENA Corporation, Linthicum, MD (US)

( * ) Notice: Subject to any disclaimer, the term of this patent is extended or adjusted under 35 U.S.C. 154(b) by 513 days.

(21) Appl. No.: 10/371,563

(22) Filed: Feb. 21, 2003

Related U.S. Application Data

(60) Provisional application No. 60/359,274, filed on Feb. 21, 2002.

(51) Int. Cl.
*G06F 11/10* (2006.01)
(52) U.S. Cl. .................... 714/785; 708/492
(58) Field of Classification Search ............... 714/785

See application file for complete search history.

(56) References Cited

FOREIGN PATENT DOCUMENTS

JP         05110451 A    *   4/1993

* cited by examiner

*Primary Examiner*—R. Stephen Dildine
(74) *Attorney, Agent, or Firm*—Dougherty 1 Clements; Christopher L. Bernard; Tyler S. Brown

(57) ABSTRACT

A method and apparatus for performing syndrome computation in a decoder of a forward error correction (FEC) system. Syndrome computation logic of the decoder uses a partial parity-check matrix to recursively generate intermediate syndrome vectors based on a code word received by the decoder and to modulo-2 add the recursively generated intermediate syndrome vectors together until a final resolved syndrome vector has been generated. This recursive use of the partial parity-check matrix enables the syndrome computations to be performed very quickly so that the decoder is suitable for use in high data rate systems and provides a very large reduction in the amount of logic needed to perform the syndrome vector computations. The reduction in the syndrome computation logic results in reduced area requirements for the logic as well as reduced power requirements.

20 Claims, 5 Drawing Sheets

$$\begin{bmatrix} S_1[n] \\ S_3[n] \\ S_5[n] \\ S_7[n] \\ \bullet \\ \bullet \\ \bullet \\ S_{75}[n] \\ S_{77}[n] \end{bmatrix} = \begin{bmatrix} 1 & \alpha^1 & \alpha^2 & \alpha^3 & \alpha^4 & \alpha^5 & \alpha^6 & & & \alpha^{29} & \alpha^{30} & \alpha^{31} \\ 1 & \alpha^3 & \alpha^6 & \alpha^9 & \alpha^{12} & \alpha^{15} & \alpha^{18} & & & \alpha^{87} & \alpha^{90} & \alpha^{93} \\ 1 & \alpha^5 & \alpha^{10} & \alpha^{15} & \alpha^{20} & \alpha^{25} & \alpha^{30} & & & \alpha^{145} & \alpha^{150} & \alpha^{155} \\ 1 & \alpha^7 & \alpha^{14} & \alpha^{21} & \alpha^{28} & \alpha^{35} & \alpha^{42} & \bullet\bullet\bullet & & \alpha^{203} & \alpha^{210} & \alpha^{217} \\ & & & & & & & \bullet & & & & \\ & & & & & & & \bullet & & & & \\ & & & & & & & \bullet & & & & \\ 1 & \alpha^{75} & \alpha^{150} & \alpha^{225} & \alpha^{300} & \alpha^{375} & \alpha^{450} & & & \alpha^{2175} & \alpha^{2250} & \alpha^{2325} \\ 1 & \alpha^{77} & \alpha^{154} & \alpha^{231} & \alpha^{308} & \alpha^{385} & \alpha^{462} & & & \alpha^{2233} & \alpha^{2310} & \alpha^{2387} \end{bmatrix} \begin{bmatrix} r_{32*n+0} \\ r_{32*n+1} \\ r_{32*n+2} \\ r_{32*n+3} \\ \bullet \\ \bullet \\ \bullet \\ r_{32*n+30} \\ r_{32*n+31} \end{bmatrix} + \begin{bmatrix} \alpha^{32} \cdot S_1[n-1] \\ \alpha^{96} \cdot S_3[n-1] \\ \alpha^{160} \cdot S_5[n-1] \\ \alpha^{224} \cdot S_7[n-1] \\ \bullet \\ \bullet \\ \bullet \\ \alpha^{2400} \cdot S_{75}[n-1] \\ \alpha^{2464} \cdot S_{77}[n-1] \end{bmatrix}$$

METHOD AND APPARATUS FOR PERFORMING SYNDROME COMPUTATION IN A DECODER OF A FORWARD ERROR CORRECTION (FEC) SYSTEM

CROSS-REFERENCE TO RELATED APPLICATIONS

This application claims priority to a provisional application that was filed on Feb. 21, 2002, entitled OC-192 Forward Error Correction and Sonet Transport Overhead ASIC Functional Specification, having Ser. No. 60/359,274, which is incorporated by reference herein in its entirety.

TECHNICAL FIELD OF THE INVENTION

The present invention relates to communications and, more particularly, to a method and apparatus for performing syndrome computation in a decoder of a forward error correction (FEC) system by recursively using a partial parity-check matrix.

BACKGROUND OF THE INVENTION

When information is transmitted over a communications link between a receiver and a transmitter, the bits that describe the information being transmitted can be corrupted. In other words, the receiver may determine that a received bit that is supposed to be a binary 1 is a binary 0, and vice versa. Corruption of bits in a data stream may be caused by a variety of factors or components in the communications link. For example, in an optical fiber network, optical energy is transmitted in the form of optical pulses that have particular levels that correspond to binary 1s and 0s. If the level of the optical energy is too low, the receiver can have difficulty determining whether a pulse corresponds to a binary 1 or a binary 0. Repeaters, or amplifiers, normally are disposed at particular locations along the communications link that amplify the optical signals so that they are at the proper levels to enable the receiver to determine whether it has received a binary 1 or a binary 0. Typically, the optical signals are converted into electrical signals at the repeaters. The electrical signals are then amplified and converted into optical signals, which are then modulated back onto the optical fiber. Similarly, at the receiver, the optical signals typically are converted back into electrical signals, which the receiver compares to a threshold value to determine whether it has received a binary 1 or a binary 0.

Because it is possible for the bits to be corrupted, techniques have been developed and implemented that provide error correction. In other words, if a bit received by the receiver is erroneously determined to be a binary 1 when it was meant to be a binary 0 when it was transmitted, and vice versa, receivers utilize various techniques to determine whether a bit value has been incorrectly identified and to correct the bit value. One known technique used for such purposes is generally referred to as the "Automatic Repeat Request" (ARQ) technique. In accordance with this technique, when the receiver detects a bit error, it sends a signal to the transmitter that tells the transmitter to retransmit the block of data that contained the error. The receiver processes the retransmitted data block and detects bit errors. The data block may need to be retransmitted several times before the receiver determines that the data is without error. Of course, retransmitting data utilizes bandwidth and generally slows down the overall throughput of the communications system.

A technique known as Forward Error Correction (FEC) is commonly used in the communications industry to reduce errors in data being transmitted over a communications link without requiring retransmission of data. FEC not only detects bit errors, but corrects detected bit errors. One of the primary advantages of FEC over ARQ is that no retransmission of data is required with FEC. This is because FEC techniques introduce redundancy in the data bits that enables the receiver of a communications system to detect errors in data being transmitted and to correct the detected errors. The redundancy generally is introduced by utilizing data bits from the data stream to encode the data stream. The receiver has a decoder that has intelligence with regard to the encoding scheme used by the transmitter, which enables the receiver to decode the data and detect and correct errors without the need for retransmission. Another advantage of FEC is that, because it does not require retransmission of data, simplex links can be used, which is desirable in certain situations, such as when the receivers are receive-only terminals.

Generally, FEC techniques and systems fall into two broad categories, namely, block coding and convolution coding. Various block coding and convolution coding techniques are currently in use in the communications industry. In the past, the use of block codes has generally been limited to use in communications systems that have relatively low data rates for various reasons, such as the aforementioned adverse effects on overall coding gain (signal-to-noise ratio, $E_b/N_o$), which is expressed in decibels (dB), for short data bursts and the reduced overall throughput that can result from the synchronization requirement. Convolution coding has generally been the preferred FEC technique for high data rate implementations. However, convolution coding results in higher output bit error rates (BER) than the output (BERs) that can be achieved using block coding. Some customers want FEC systems with very low BERs (e.g., $10^{-15}$), which generally cannot be achieved using convolution coding, but which can be achieved using block coding, such as Bose-Chaudhuri-Hocquenghem (BCH) block coding, for example.

FEC decoding requires that a vector known as the syndrome vector be computed by multiplying the code word received by the decoder of the FEC system receiver by a matrix known as the parity-check matrix. The computation of the syndrome vector for a linear block code (e.g., BCH) in an FEC system using known computation techniques typically requires multiplication by a parity-check matrix that is so large that the computations cannot be performed at high data bit rates. Also, due to the large matrix multiplication that is normally required, a large number of logic gates are needed, which increases the amount of area needed on an integrated circuit (IC) to implement the syndrome computation logic. In addition, the large number of gates consume a large amount of power.

It would be desirable to provide an FEC decoder that is capable of performing syndrome computation quickly so that it is suitable for use in high data rate systems and that utilizes a reduced amount of computation logic, thereby decreasing area and power requirements. Accordingly, a need exists for a method and apparatus for performing syndrome computation in an FEC decoder quickly so that the decoder is suitable for use in high data rate systems and with a reduced amount of computation logic so that the area and power requirements associated with syndrome computation are reduced.

SUMMARY OF THE INVENTION

The present invention provides a method and apparatus for performing syndrome computation in a decoder of an FEC system. The apparatus of the present invention comprises syndrome computation logic that recursively uses a partial parity-check matrix to compute the syndrome vector. Syndrome computation logic of the decoder uses the partial parity-check matrix to recursively generate intermediate syndrome vectors based on a code word received by the decoder and modulo-2 adds the recursively generated intermediate syndrome vectors together until a final resolved syndrome vector has been generated.

This recursive use of the partial parity-check matrix enables the syndrome computations to be performed very quickly so that the decoder is suitable for use in high data rate systems and provides a very large reduction in the amount of logic needed to perform the syndrome vector computations. The reduction in the syndrome computation logic results in reduced area requirements for the logic as well as reduced power requirements.

These and other features and advantages of the present invention will become apparent from the following description, drawings and claims.

BRIEF DESCRIPTION OF THE DRAWINGS

FIG. 1 mathematically illustrates the known technique of computing the syndrome vector using a full parity-check matrix.

FIG. 2 mathematically illustrates computation of the syndrome vector in accordance with the present invention by using a partial parity-check matrix in conjunction with a recursive computation algorithm.

DETAILED DESCRIPTION OF THE PREFERRED EMBODIMENT OF THE INVENTION

Figure 3:
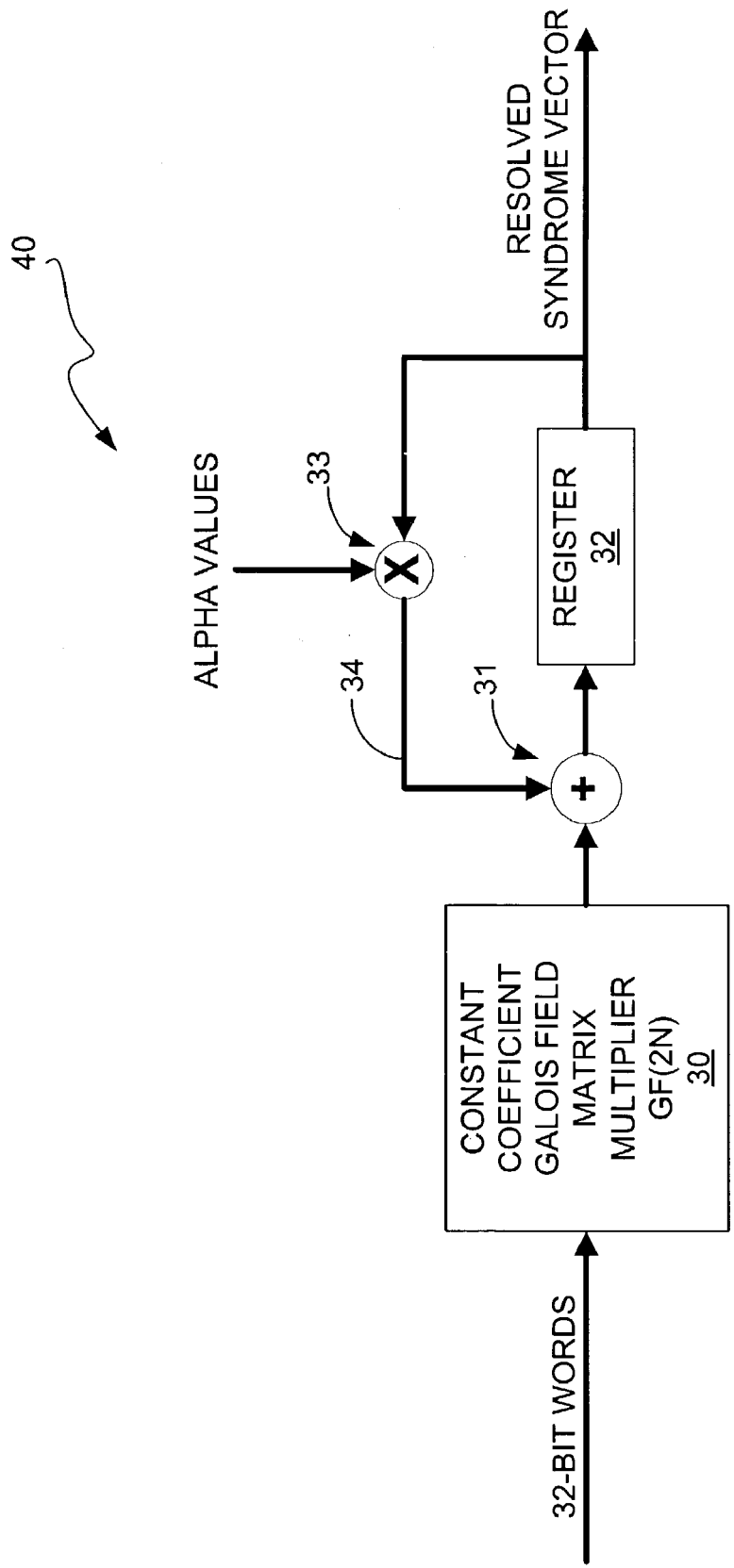
FIG. 3 is a block diagram of the syndrome computation logic block of the present invention in accordance with the preferred embodiment.

The present invention provides a decoder comprising a syndrome computation logic block that recursively utilizes a partial parity-check matrix to generate the syndrome vector. As will become apparent from the following description, this recursive use of a partial parity-check matrix enables the syndrome computations to be performed very quickly so that the decoder is suitable for use in high data rate systems and provides a very large reduction in the amount of logic needed to perform the syndrome vector computations.

The example embodiment of the present invention described herein demonstrates the manner in which the present invention can be used to perform syndrome computation for an FEC BCH code word of length n=7680 bits, of which k=7173 bits correspond to the message word and l=507 bits correspond to the length of the parity vector. The code word is processed using i-bits every system clock cycle. Each n-bit code word is subdivided into n/i i-bit words. If i did not divide evenly into n the first i-bit word will be padded with 0s in front of the message bits so that the first word will have i bits. In the example embodiment of the present invention, i=32.

Figure 1:
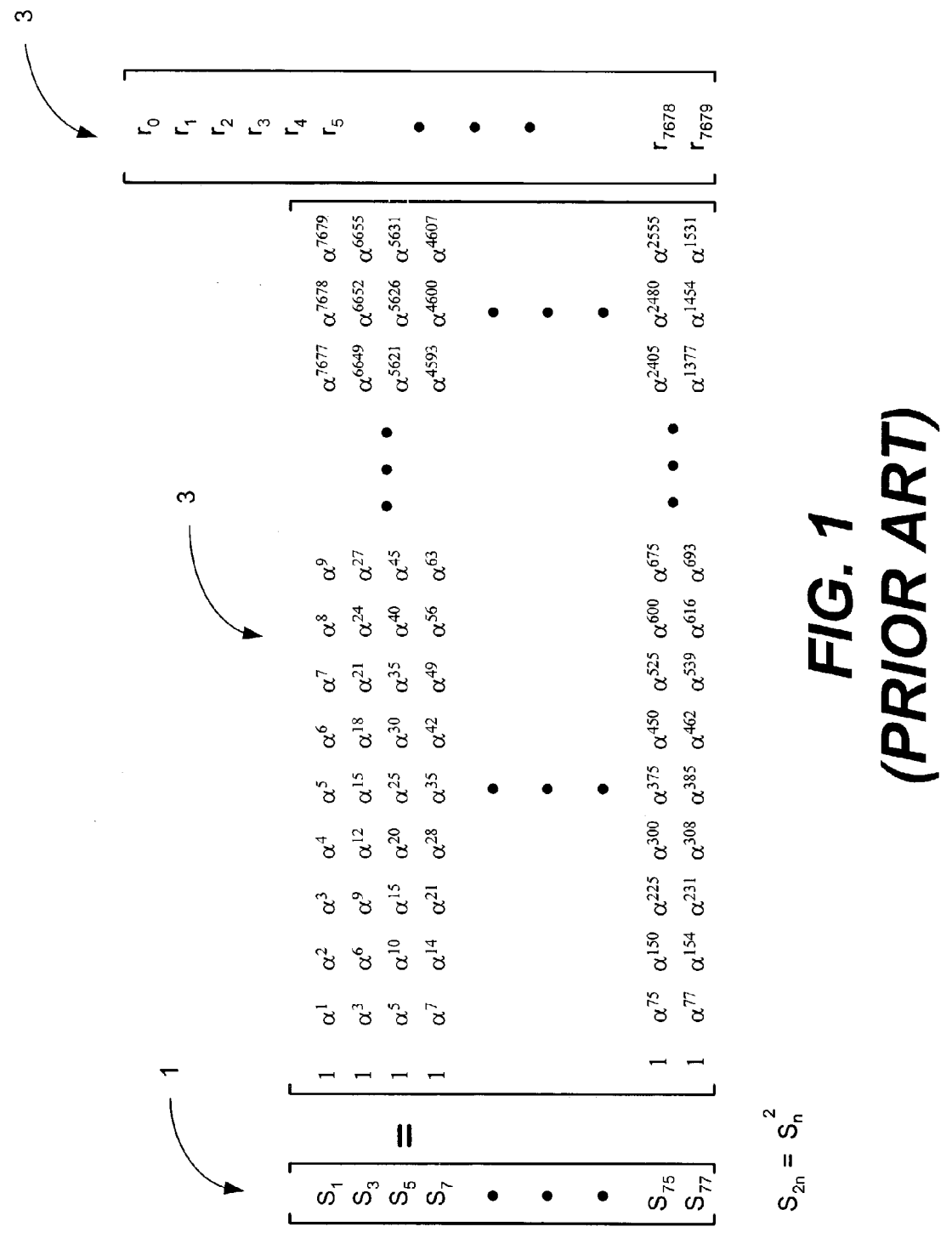

The FEC code in accordance with the example embodiment of the present invention has an error correction capability of 39 errors per non-interleaved block, and 156 errors with 4 way bit-interleaving (not shown). For ease of explanation and illustration, a single block of syndrome computation logic is shown and described herein (i.e., block interleaving is not illustrated). Therefore, the error correction capability of the block of syndrome computation logic described in the example embodiment of the present invention is 39. However, the present invention is not limited with respect to error correction (i.e., parity vector length), code word length, message word length, the number of interleaving selections, etc. Those skilled in the art will understand that such variables are chosen based on a selected implementation. Also, the present invention is not limited to any particular type of block coding, but in the preferred embodiments described herein, BCH block coding is used. However, those skilled in the art will understand, in view of the description provided herein, that the present invention is equally applicable to all types of block coding, and that the present invention is being with reference only to BCH coding for purposes of brevity. Also, FIG. 1 mathematically illustrates, using the example variables given above, the known technique of computing a syndrome vector $S_1$, $S_3$, $S_5$ . . . $S_{77}$, designated by the reference numeral 1, by multiplication of the received code word $r_0$, $r_1$, $r_2$, $r_3$ . . . $r_{7679}$, designated by the reference numeral 2, by the full parity-check matrix 3. It should be noted that the syndrome vector 1 includes only odd Syndrome values are contained in the syndrome vector 1. Each respective even syndrome vector value can be computed by squaring a preceding odd syndrome value in accordance with the equation $S_{2n}=(S_n)^2$. Thus, the syndrome vector 1 has only odd terms, and in this example embodiment, is a 39-word vector due to the fact that the chosen error correction capability for this example is 39 errors per received code word. If the syndrome vector is all zeros, the received code word $r_0$ through $r_{7679}$ is valid and contains no errors. Otherwise, the location and magnitude of the errors can be computed by the stages (not shown) of the decoder that follow the syndrome computation logic block, provided there are 39 or less bits in error. Generally, the number 39 is a function of the BCH code, which has a formula that determines the error correction capability value based on the length of the code word and the length of the message word, which are n=7680 and k=7173, respectively, in this example.

With reference again to FIG. 1, the parity-check matrix 3 comprises 39 rows, and n columns, with n=7680 in this example. Thus, the full parity-check matrix 3 is very large. Consequently, multiplication of the received code word $r_n$ by the full parity-check matrix 3 would involve an enormous amount of computation logic and a large amount of time. FIG. 2 mathematically illustrates computation of the syndrome vector in accordance with the present invention by using a partial parity-check matrix in conjunction with a recursive computation algorithm. In accordance with the present invention, the partial parity-check matrix 10 preferably has the same number of rows (39) as the full parity-check matrix 3 shown in FIG. 1, but has only i columns, whereas the full parity-check matrix 3 has n columns, as stated above, where n=7680 in this example. In other words, the partial parity-check matrix 10 of the present invention is an (39×i) matrix, whereas the full parity-check matrix shown in FIG. 2 is an (39×n) matrix.

The partial parity-check matrix 10 of the present invention has the same first 39 rows of the full parity check matrix 3 (assuming the same variables, e.g., code word length, message word length, error correction, etc.), and only i columns of the full parity-check matrix 3. The powers of $\alpha$ in the parity-check matrices 3 and 10 are determined in accordance with Galois mathematics. The powers of $\alpha$ will vary depending on the particular implementation. For example, for a parity-check matrix where i=32 the powers of $\alpha$ will be different from those for a parity-check matrix where i=16 or 64, for example. Those skilled in the art will understand, in view of the description provided herein, the manner in which the partial parity-check matrix 10 of the present invention can be created using principles of Galois math and taking implementation details into account.

This enormous reduction in the size of the parity-check matrix in accordance with the present invention greatly reduces the amount of syndrome computation logic needed to perform the operations necessary to compute the syndrome vector, as described in more detail below with reference to FIG. 4. The parity-check matrix 10 of the present invention can be reduced to a partial parity-check matrix because a recursive algorithm is used during the matrix multiplication process that iteratively multiplies the syndrome vectors computed in previous cycles, which are intermediate syndrome vectors, by certain $\alpha$ values to produce intermediate syndrome vectors that are modulo-2 added to the syndrome vectors for the current cycle. This iterative process continues until the syndrome vectors have been computed for all of the i-bit words of the n-bit message word, which would be 240 iterations in the example embodiment (240 32-bit words).

The nature of the iterative process of the present invention is demonstrated by the equation of the present invention shown in FIG. 2. In FIG. 2, the variable n, which corresponds to the number of bits in a code word (7680 in this example), is incremented by 1 after a 32-bit received word 11 has been processed. For example, during the first iteration when n=0, the received 32-bit word 11 will be the values for bits 0, 1, 2 . . . 31. During the second iteration when n=1, the received 32-bit word 11 will be values for bits 32, 33, 34 . . . 63. During the third iteration when n=2, the received 32-bit word 11 will be the values for bits 64, 65, 66 . . . 95, and so on until n=7680 and the entire 7680-bit code word has been processed. The recursive portion of the algorithm is represented by the vector 12. During the iterations, as the vector 11 is being multiplied by the partial parity-check matrix 10, for each value of n, the values of $S_1, S_3, S_5, S_7, S_9 \ldots S_{77}$ for the previous cycle are being multiplied by certain respective $\alpha$ values as shown to generate previous-cycle intermediate syndrome vectors, which are modulo-2 added to the results of the multiplication of the received data vector 11 by the partial parity-check matrix 10. For each 32-bit received word, multiplication of vector 11 by matrix 10 results in 39 13-bit intermediate syndrome vectors, which are modulo-2 added to the respective syndrome vectors for the previous cycle. After n/i iterations (n/i=240 in this example), the syndrome vector 20 is finally resolved for the respective code word.

FIG. 3 is a block diagram of the syndrome computation apparatus 40 of the present invention in accordance with the preferred embodiment. The block diagram represents the logic for processing an entire 7680-bit code word to generate a final, or resolved syndrome vector. As shown 240 32-bit words are processed by a constant-coefficient Galois field matrix multiplier $GF(2^N)$ 30, which performs the operations represented in FIG. 2 by the multiplication of received data vector 11 by the partial parity-check matrix 10. Galois field multipliers are known in the FEC art, and the present invention is not limited to using any particular Galois multiplier. The register 32 indicates the storage of the intermediate syndrome vectors that are modulo-2 added together (current cycle with previous cycle values) as they are generated. After the last of the 240 32-bit words has been processed, the syndrome vector stored in the register 32 will be the resolved syndrome vector for the respective code word.

The multiplier logic 33 corresponds to the multiplication operations represented in FIG. 2 by the vector 12 corresponding to multiplication of the $\alpha$ values $\alpha^{32}, \alpha^{96} \ldots \alpha^{2464}$ by respective syndrome vectors $S_1[n-1]$, $S_3[n-1]$, $S_5[n-1] \ldots S_{77}[n-1]$ from the immediately preceding cycle. The adder logic 31 corresponds to the iterative modulo-2 addition of these previous-cycle syndrome vectors by the results of the multiplication of vector 11 with partial parity-check matrix 10. The feedback loop 34 indicates that the operations are iterative, or recursive, and that the intermediate syndrome vectors from previous cycles are modulo-2 added to the output of multiplier 30.

Figure 4:
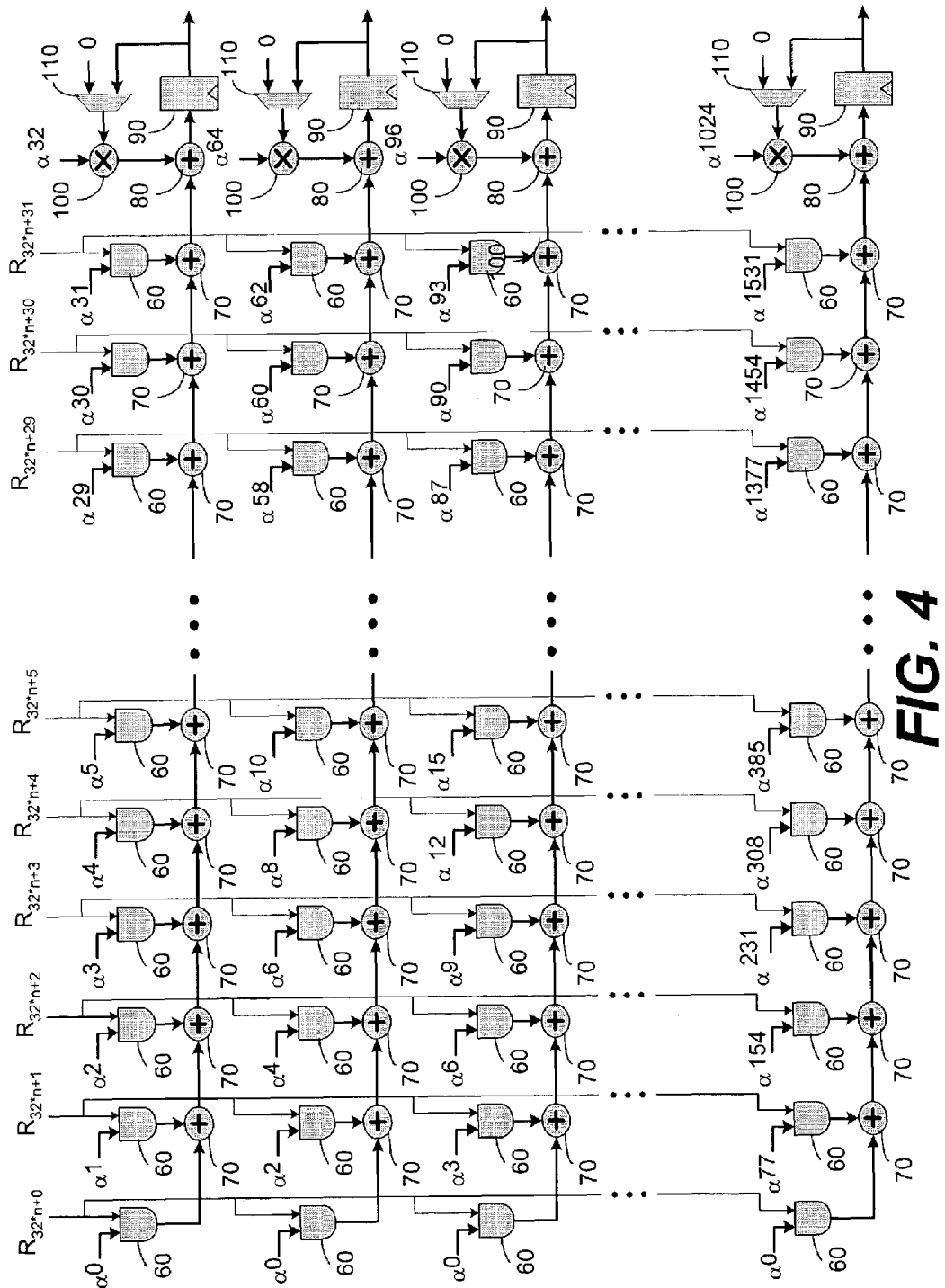
FIG. 4 is a schematic diagram of the syndrome computation logic of the apparatus of the present invention shown in FIG. 3 in accordance with the preferred embodiment.

FIG. 4 is a schematic diagram of the logic used in accordance with the preferred embodiment of the present invention to perform the operations represented by the equation shown in FIG. 2. When a matrix is multiplied by a vector, terms are multiplied and the results of the multiplication operations are summed in a particular manner that is well known in linear algebra mathematics. In FIG. 2, the terms $R_{32*n+0}$ through $R_{32*n+31}$ are binary multiplied by the a coefficients shown by the AND gates 60. The outputs of the AND gates are binary summed as shown by XOR gates, which are represented by the "+" signs 70 due to drawing page constraints. The summed results are stored in memory, which is represented by the flip-flops 90. The combination of the flip-flops 90, adders 80 (XOR), multipliers 100 and multiplexer logic 110 at the end of each row of gates in FIG. 4 cause the respective syndrome value $S_i$ in vector 12 (FIG. 2) from the previous cycle to be multiplied by its respective $\alpha$ coefficient in vector 12 to generate the intermediate values for the syndrome vector. The flip-flops 90 store the syndrome values from the previous cycle, and on the next cycle, the values in the flip-flops 90 are clocked out of flip-flops 90 and output from respective multiplexer logic 110 to respective multiplier logic 100, which binary multiplies the respective syndrome values of vector 12 from the previous cycle by the respective $\alpha$ values in vector 12. The results of this multiplication are then added to the results of multiplication of vector 11 by matrix 10 for the current cycle by the adder logic 80. The results of this addition are then stored in the flip-flops 90 so that they will be available as syndrome values from the previous cycle on the next cycle. As described above, this iterative process of computing syndrome values, storing them as intermediate syndrome values and then modulo-2 adding the stored, previous-cycle values to the syndrome values for the current cycle, continues for 240 cycles (in this example), which is when the syndrome vector for the current code word is resolved.

The method of the present invention in accordance with the preferred embodiment will now be described with reference to the flow chart illustrated in FIG. 5, the equation shown in FIG. 2 and the block diagram shown in FIG. 3. The order of the blocks of the flow chart does not necessarily represent the order in which the steps of the method are performed. The first received word $r_0$ through $r_{31}$ to be operated on, which is represented by vector 11 (FIG. 2), is provided to the Galois filed multiplier logic component 30

Figure 5:
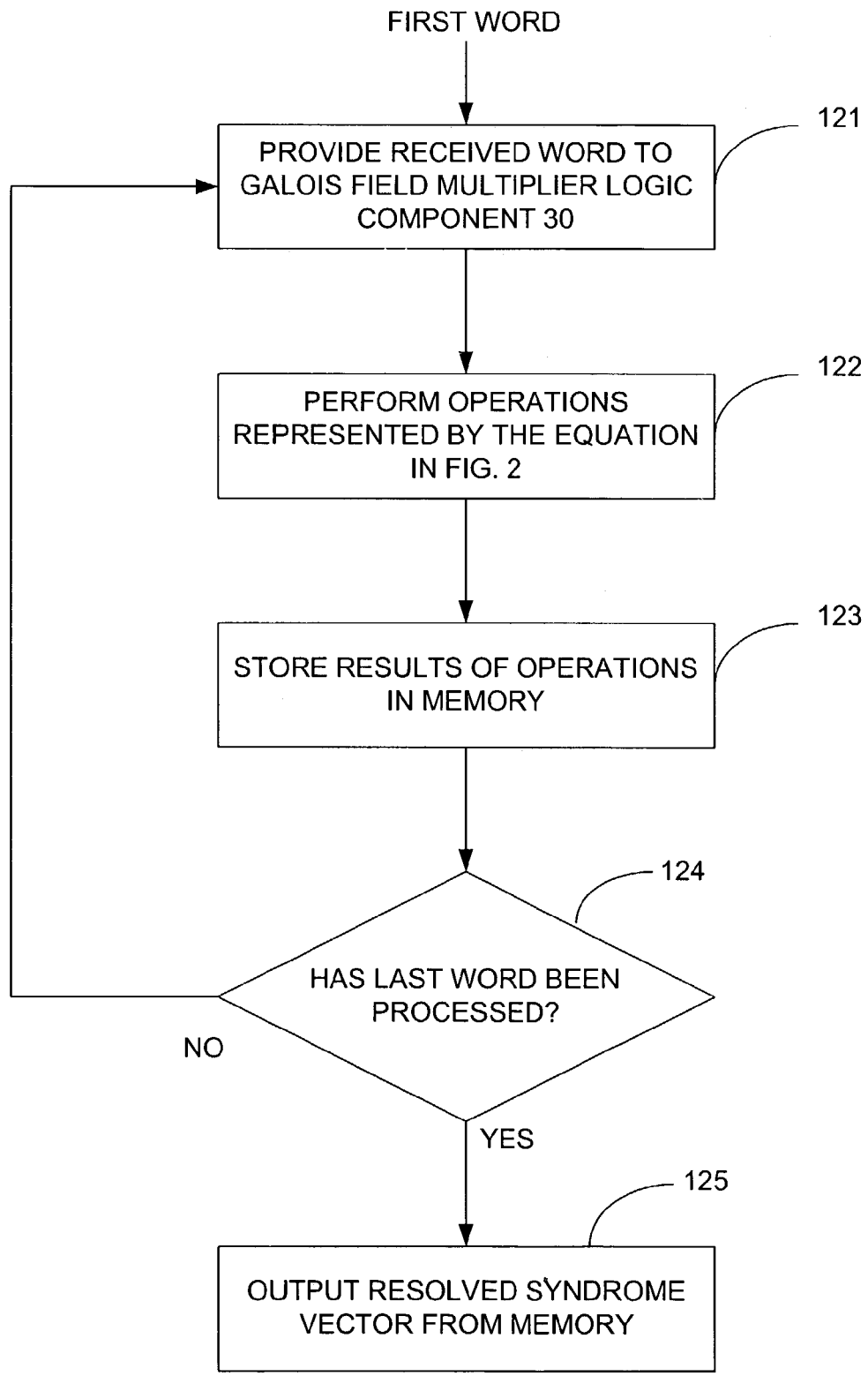
FIG. 5 is a flow chart illustrating the method of the present invention in accordance with the preferred embodiment performed by the apparatus shown in FIG. 3.

(FIG. 4), as indicated by block 121 in the flow chart of FIG. 5. The multiplication operations (ANDing) and modulo-2 addition operations (XORing) associated with multiplying the receive vector 11 by the partial parity-check matrix 10 are then performed on the receive vector, as indicated by block 122. The results of the operations produced by the step represented by block 122 are stored in memory (e.g., register 32 shown in FIG. 3), as indicated by block 123.

A determination is then made as to whether the syndrome vector $S_i$ has resolved into the final syndrome vector for the code word, as indicated by decision block 124. This determination can be accomplished in a variety of ways. For example, as indicated above, a counter can increment the value of n by one each time a word is processed and a comparator can be used to determine when the total number of receive words (e.g., 240 32-bit words) that make up the receive vector r have been processed, thus indicating that the syndrome vector $S_i$ has resolved to its final value. For example, if 240 32-bit words make up a code word (the code word includes the message bits and the parity bits), the counter will increment from 0 to 239. Once the counter has incremented to 239 (i.e., 240 incrementations), the last word will have been processed by the Galois field multiplier logic component 30 and stored in register 32. When the comparator determines that the counter has incremented n from 0 to 239, the results stored in the register 32 correspond to the resolved syndrome vector $S_i$, which is then output from the register 32 of the syndrome computation logic block 40, as indicated by block 125. The resolved syndrome vector output from the register 32 is used by other logic (not shown) of the decoder, which analyzes the syndrome vector $S_i$, determines which bits in the code word need to be corrected, and then corrects the bit errors. The logic used to find the location of the bit errors in the code word and correct them is the subject of one or more other applications and will not be discussed herein in the interest of brevity.

Tthe present invention has been described with reference to particular embodiments for the purposes of demonstrating the principles and concepts of the present invention. Those skilled in the art will understand that present invention is not limited to these example embodiments. Also, those skilled in the art will understand, in view of the present disclosure, that a variety of logical configurations can be used to achieve the goals of the present invention. It should also be noted that although the present invention has been described herein as being performed in hardware in an IC (e.g., an application specific integrated circuit (IC)), the present invention may be implemented in hardware, in a combination of hardware and software, in a microprocessor, in a field programmable gate array, etc. Those skilled in the art will understand the way in which the tasks discussed herein can be performed by a variety of such physical implementations. Those skilled in the art will understand that a variety of changes can be made to the configurations described herein and that all such modifications are within the scope of the present invention.

What is claimed is:

1. An apparatus for performing syndrome computation in a decoder of a forward error correction (FEC) system, the apparatus comprising syndrome computation logic configured to use a partial parity-check matrix to recursively generate intermediate syndrome vectors based on a code word received by the decoder and to modulo-2 add the recursively generated intermediate syndrome vectors together until a final resolved syndrome vector has been generated, wherein said syndrome computation logic comprises:

Galois field matrix multiplication logic configured to multiply a plurality of receive vectors of the code word, each having a plurality of receive bits, by the partial parity-check matrix to compute the intermediate syndrome vectors:

binary multiplication logic configured to multiply respective constant coefficient values by respective intermediate syndrome vectors computed by the Galois field multiplication logic in an immediately preceding cycle;

binary addition logic configured to modulo-2 add respective intermediate syndrome vectors computed in a current cycle by the Galois field multiplication logic to respective intermediate syndrome vectors computed by the Galois field multiplication logic in said immediately preceding cycle; and memory element logic configured to store the intermediate syndrome vectors and results of the recursive modulo-2 addition of the intermediate syndrome vectors, and wherein after a particular number of intermediate syndrome vectors have been recursively generated and modulo-2 added together, the memory element contains a final resolved syndrome vector.

2. The apparatus of claim 1, wherein the apparatus is a decoder implemented in a forward error correction (FEC) system, the decoder comprising the syndrome computation logic.

3. The apparatus of claim 1, wherein the partial parity-check matrix has a number of rows equal to a number of rows in a full parity-check matrix and a number of columns that is less than a number of columns in said fall parity-check matrix.

4. The apparatus of claim 3, wherein the final resolved syndrome vector indicates whether or not errors exist in the received code word, the code word being made up of a plurality of receive words, each receive word constituting a receive vector, each receive vector having i bits, and wherein the number of columns in the partial parity-check matrix is equal to i, and wherein each respective receive vector is operated on by the syndrome computation logic separately and recursively to produce a respective syndrome vector.

5. The method of claim 4, wherein the code word has n bits, and wherein a total of n intermediate syndrome vectors are computed and binary added together to produce the final resolved syndrome vector, each binary addition of intermediate syndrome vectors adding respective intermediate syndrome vectors produced during an immediately preceding cycle with respective intermediate syndrome vectors produced during a current cycle.

6. The apparatus of claim 4, wherein the code word has n bits and the syndrome computation logic generates a total of n intermediate syndrome vectors and performs n modulo-2 additions of said n intermediate syndrome vectors to produce the final resolved syndrome vector, each modulo-2 addition of intermediate syndrome vectors corresponding to modulo-2 addition of respective intermediate syndrome vectors produced during an immediately preceding cycle with respective intermediate syndrome vectors produced during a current cycle.

7. The apparatus of claim 6, wherein each of said n intermediate syndrome vector has i terms, each of said i terms having a plurality of bits.

8. The apparatus of claim 7, wherein the syndrome computation logic comprises storage logic configured to store each intermediate syndrome vector and results of each modulo-2 addition of intermediate syndrome vectors.

9. The apparatus of claim 8, wherein the syndrome computation logic further comprises:

binary multiplication logic configured to binary multiply respective parity-check matrix coefficients by respective intermediate syndrome vectors output from the storage logic, the intermediate syndrome vectors output from the storage logic corresponding to said respective intermediate syndrome vectors produced in an immediately preceding cycle; and binary addition logic configured to modulo-2 add said respective intermediate syndrome vectors produced during an immediately preceding cycle with said respective intermediate syndrome vectors produced during a current cycle.

10. The apparatus of claim 1, wherein the code word is a Bose-Chaudhuri-Hocquenghem (BCH) block code word.

11. The apparatus of claim 1, wherein the syndrome computation logic comprises AND gates for performing binary multiplication and exclusive-OR (XOR) gates for performing modulo-2 addition.

12. The apparatus of claim 1, wherein the syndrome computation logic comprises NAND gates for performing binary multiplication and exclusive-NOR (XNOR) gates for performing modulo-2 addition.

13. A method for performing syndrome computation in a decoder of a forward error correction (FEC) system, the method comprising using a partial parity-check matrix to recursively generate intermediate syndrome vectors based on a code word received by the decoder and to modulo-2 add the recursively generated intermediate syndrome vectors together until a final resolved syndrome vector has been generated, wherein said method comprises using:

Galois field matrix multiplication logic configured to multiply a plurality of receive vectors of the code word, each having a plurality of receive bits, by the partial parity-check matrix to compute the intermediate syndrome vectors;

binary multiplication logic configured to multiply respective constant coefficient values by respective intermediate syndrome vectors computed by the Galois field multiplication logic in an immediately preceding cycle;

binary addition logic configured to modulo-2 add respective intermediate syndrome vectors computed in a current cycle by the Galois field multiplication logic to respective intermediate syndrome vectors computed by the Galois field multiplication logic in said immediately preceding cycle; and memory element logic configured to store the intermediate syndrome vectors and results of the recursive modulo-2 addition of the intermediate syndrome vectors, and wherein after a particular number of intermediate syndrome vectors have been recursively generated and modulo-2 added together, the memory element contains a final resolved syndrome vector.

14. The method of claim 13, wherein the method is performed in syndrome computation logic of a decoder of a forward error correction (FEC) system.

15. The method of claim 14, wherein the partial parity-check matrix has a number of rows equal to a number of rows in a full parity-check matrix and a number of columns that is less than a number of columns in said full parity-check matrix.

16. The method of claim 15, wherein the final resolved syndrome vector indicates whether or not errors exist in the received code word, the code word being made up of a plurality of receive words, each receive word constituting a receive vector, each receive vector having i bits, and wherein the number of columns in the partial parity-check matrix is equal to i, and wherein each respective receive vector is operated on by the syndrome computation logic separately and recursively to produce a respective syndrome vector.

17. A method for performing syndrome computation in a decoder of a forward error correction (FEC) system, the method comprising the steps of:

using Galois field matrix multiplication to multiply a plurality of receive vectors of the code word, each having a plurality of receive bits, by a partial parity-check matrix to compute a plurality of intermediate syndrome vectors;

binary multiplying respective constant coefficient values of the matrix by respective intermediate syndrome vectors computed by the Galois field multiplication during an immediately preceding cycle;

binary adding respective intermediate syndrome vectors computed during a current cycle by the Galois field multiplication to respective intermediate syndrome vectors computed by the Galois field multiplication during said immediately preceding cycle; and storing the intermediate syndrome vectors and results of the recursive modulo-2 addition of the intermediate syndrome vectors in a memory element, and wherein after a particular number of intermediate syndrome vectors have been recursively generated and modulo-2 added together, the memory element contains a final resolved syndrome vector.

18. A computer program for performing syndrome computation in a decoder of a forward error correction (FEC) system, the computer program being embodied on a computer-readable medium, the program comprising a routine that uses a partial parity-check matrix to recursively generate intermediate syndrome vectors based on a code word received by the decoder and modulo-2 adds the recursively generated intermediate syndrome vectors together until a final resolved syndrome vector has been generated, wherein said program comprises:

Galois field matrix multiplication logic configured to multiply a plurality of receive vectors of the code word, each having a plurality of receive bits, by the partial parity-check matrix to compute the intermediate syndrome vectors;

binary multiplication logic configured to multiply respective constant coefficient values by respective intermediate syndrome vectors computed by the Galois field multiplication logic in an immediately preceding cycle;

binary addition logic configured to modulo-2 add respective intermediate syndrome vectors computed in a current cycle by the Galois field multiplication logic to respective intermediate syndrome vectors computed by the Galois field multiplication logic in said immediately preceding cycle; and memory element logic configured to store the intermediate syndrome vectors and results of the recursive modulo-2 addition of the intermediate syndrome vectors, and wherein after a particular number of intermediate syndrome vectors have been recursively generated and modulo-2 added together, the memory element contains a final resolved syndrome vector.

19. The computer program of claim 18, wherein routine uses the partial parity multiplication sub-matrix by binary multiplying a plurality of message vectors comprising a plurality of message bits by the partial parity multiplication sub-matrix to produce the intermediate parity vectors, and wherein the program further comprises:

a code segment that stores the intermediate parity vectors and results of the recursive modulo-2 addition of the intermediate parity vectors in a memory element, and wherein after a particular number of intermediate parity vectors have been recursively generated and modulo-2 added together, the memory element contains a final parity vector.

20. A computer program for performing syndrome computation in a decoder of a forward error correction (FEC) system, the computer program being embodied on a computer-readable medium, the program comprising:

a first code segment that uses Galois field matrix multiplication to multiply a plurality of receive vectors of a code word, each having a plurality of receive bits, by a partial parity-check matrix to compute a plurality of intermediate syndrome vectors;

a second code segment for binary multiplying respective constant coefficient values of the matrix by respective intermediate syndrome vectors computed by the first code segment during an immediately preceding cycle;

a third code segment for binary adding respective intermediate syndrome vectors computed during a current cycle by the Galois field multiplication to respective intermediate syndrome vectors computed by the Galois field multiplication during said immediately preceding cycle; and a fourth code segment for storing the intermediate syndrome vectors and results of the recursive modulo-2 addition of the intermediate syndrome vectors in a memory element, and wherein after a particular number of intermediate syndrome vectors have been recursively generated and modulo-2 added together, the memory element contains a final resolved syndrome vector.

* * * * *